United States Patent [19]

Rosien

[11] Patent Number: 5,146,089
[45] Date of Patent: Sep. 8, 1992

[54] ION BEAM DEVICE AND METHOD FOR CARRYING OUT POTENTIAL MEASUREMENTS BY MEANS OF AN ION BEAM

[75] Inventor: Jürgen Rosien, Riemerling, Fed. Rep. of Germany

[73] Assignee: ICT Integrated Circuit Testing Gesellschaft fur Halbleiterpruftechnik mbH, Fed. Rep. of Germany

[21] Appl. No.: 631,472

[22] Filed: Dec. 20, 1990

[30] Foreign Application Priority Data

Jan. 10, 1990 [DE] Fed. Rep. of Germany ....... 4000579

[51] Int. Cl.$^5$ ............................................. H01J 37/28
[52] U.S. Cl. ..................................... 250/309; 250/397
[58] Field of Search ......................... 250/309, 310, 397

[56] References Cited

U.S. PATENT DOCUMENTS

| 3,534,385 | 10/1970 | Castaing et al. | 250/309 |
| 3,845,305 | 10/1974 | Liebl | 250/309 |
| 4,728,790 | 3/1988 | Plies | 250/310 |
| 4,896,036 | 1/1990 | Rose et al. | 250/310 |
| 4,983,830 | 1/1991 | Iwasaki | 250/310 |
| 5,061,856 | 10/1991 | Frosien et al. | 250/309 |

Primary Examiner—Bruce C. Anderson
Attorney, Agent, or Firm—Learman & McCulloch

[57] ABSTRACT

The invention relates to an ion beam device into which a secondary electron spectrometer is integrated, the scintillator being formed by the central electrode of the objective lens. Such an ion beam device permits not only the usual boring of holes but also at the same time very accurate potential measurements.

4 Claims, 2 Drawing Sheets

ION BEAM DEVICE AND METHOD FOR CARRYING OUT POTENTIAL MEASUREMENTS BY MEANS OF AN ION BEAM

TECHNICAL FIELD

The invention relates to an ion beam device including an ion source and a blanking system for producing a pulsed ion beam, a deflector for deflecting the ion beam and an electrostatic objective lens with three rotationally symmetrical electrodes arranged one behind the other in the beam direction and having an objective lens axis that coincides with the axis of the ion beam, which focuses the ion beam on the test piece and a method for carrying out potential measurements on structures in integrated circuits by means of a pulsed ion beam.

BACKGROUND OF THE INVENTION

Electron beam measuring technology is currently used for error analysis and voltage measurement in integrated circuits. However, in modern circuits this technology comes up against certain limits which can only be overcome with difficulty.

For instance, modern circuits frequently include multi-layer wiring, so that some of the measurement points in question are not accessible to the electron beam.

Furthermore, circuits are coated with an insulating passivation layer which must be removed before measurement since it is only possible to carry out qualitative, not quantitative measurements through the passivation layer.

Because of the necessary low electron energy of the scanning electron beam, electrical and magnetic fields produced by the testpiece also have a disruptive effect. These fields deflect the primary electron beam so that it is difficult to keep it on the conductive track under examination.

In order to solve the first two problems mentioned above, ion beam devices are known by means of which holes are etched through upper metal planes or through passivation layers in order to expose the measurement point in question. An ion beam device of this type is described for example in "Proceedings of the Intern, Reliability Physics Symposion", 1989, pages 34–52.

However, according to the etching process a separate electron beam tester is necessary for the actual potential measurement. Thus two separate devices are necessary, which is not only costly by also very time-consuming since the point in question has to be found again every time. There is also the difficulty that the testpiece has to be reintroduced into the ion beam device whenever a new measurement point is required which has not been previously prepared.

In order to solve the third problem mentioned in the introduction (deflection of the electron beam by disruptive influences) it was necessary in the past to use costly electronic compensation methods.

SUMMARY OF THE INVENTION

The object of the invention, therefore, is to make further developments to an ion beam device so that it can be used not only for etching holes but also for carrying out very accurate potential measurements. It is a further object of the invention to make further developments to the method for carrying out potential measurements using such an ion beam device so as to compensate for the removal of testpiece material during the measurement.

It is known that when boring holes by means of an ion beam device the ion beam emits secondary electrons when it strikes the testpiece. This effect has already been used in order to create potential contrast images of a circuit using an ion beam device ("Electronics Letters" 23, 1987, 11, p. 585). However, this publication does not relate to the carrying out of quantitative potential measurements.

In the extensive tests on which the invention is based it was attempted first of all to arrange a secondary electron spectrometer, i.e. an extraction electrode, a filter electrode and a secondary electron detector with scintillator (the said elements being connected to one another by an external control circuit) between the objective lens of an ion beam device and the testpiece.

However, in these tests it was found that in such an arrangement the working distance between the objective lens and the testpiece is too great, which increases the lens aberrations of the objective lens (particularly the axial chromatic aberration and the aperture aberration) and thus reduces the local resolution of the device.

On the other hand, a satisfactory solution to the problems referred to above can be achieved according to the invention by the combination of the following features:

A secondary electron spectrometer which contains an extraction electrode, a filter electrode, a scintillator and a control circuit connecting the scintillator to the filter electrode is integrated into the ion beam device;

the scintillator is formed in this case by the central electrode of the objective lens.

If the secondary electron spectrometer is integrated into the objective lens in this way, then the ion beam device is broadened to an ion beam tester by means of which all known techniques of electron beam measuring technology, particularly quantitative voltage measurement, can be carried out. In this case (by contrast with the aforementioned version which is not yet satisfactory) it is particularly advantageous that by integrating the secondary electron spectrometer into the objective lens the working distance between the objective lens and the testpiece can be kept minimal, so that the lens aberrations of the objective lens are reduced and the local resolution of the device is increased.

In the construction according to the invention the extraction electrode of the secondary electron spectrometer is mounted close above the testpiece. The filter electrode of the spectrometer follows at a small distance (of a few mm). The scintillator of the secondary electron detector is integrated directly into the central electrode of the objective lens. This is possible because the central electrode of the objective lens is at a high positive potential and therefore all secondary electrons which pass through the filter electrode land there.

The light generated by the scintillator is supplied directly via photoconductors or via an optical system to a multiplier which converts the light signal into an electrical signal which is then further processed in a known manner.

The essential advantage of the ion beam measuring device according to the invention resides in the fact that the same device with which holes are produced in the metal coating or passivation of a circuit can be used simultaneously to carry out the electric potential measurement. It is therefore necessary to make bores only at the points where they are really required, which offers a significant advantage in terms of time.

Since an incident ion beam emits more secondary electrons than an electron beam, a greater signal which can be analysed is produced—by comparison with an electron beam tester—which increases the accuracy and/or the speed of measurement.

In addition, with an ion beam it is possible to work at higher primary energy levels than with an electron beam.

A 30 keV ion beam has the same depth of penetration as a low-energy electron beam in the 1 keV range. Accordingly a high-energy ion beam can also be used for measurement within the circuit without damage. However, the high-energy primary beam has the advantage that electrical and magnetic interference fields in the proximity of the testpiece, which are to some extent produced by the testpiece itself, no longer cause disruption. This facilitates an accurate and stable positioning of the ion probe on the testpiece.

The at least partial integration of the secondary electron spectrometer into the objective lens facilitates a short working distance and a high local resolution and thus a measurement even on the finest structures.

Naturally, the invention can also be applied to systems with immersion lenses. In these devices the ion energy in the upper part of the column is high. The ions are first of all retarded in the objective lens to the desired final energy. This has the advantage that the aberration coefficients of the objective lens can be further improved, since counter-field arrangements generally have better optical properties.

The fact that material is removed from the testpiece during the measurement represents a certain problem in the ion beam device according to the invention. However, calculations show that a potential measurement can be carried out so quickly that this removal is in most cases negligible and therefore not disruptive.

If in exceptional cases the structures on which measurement is carried out are so fine or so thin that the removal has negative effects, then according to the invention the following compensation measures can be taken:

During the measurement the ion beam is scanned in the direction in which the structure is expanded.

During the measurement a conductive material (e.g. a metal) is deposited which equalises the removal. Methods for ion beam-induced deposition are known from the literature.

Scanning is achieved by deflecting the ion beam so that the ion beam is directed at other locations on a test piece. Metal is deposited on a test piece as disclosed in U.S. Pat. No. 4,983,830 to Iwasaki.

It goes without saying that the two compensation measures referred to above can also be used in combination.

One embodiment of the invention is illustrated in the drawings, in which:

DESCRIPTION OF THE PREFERRED EMBODIMENTS

Figure 1:
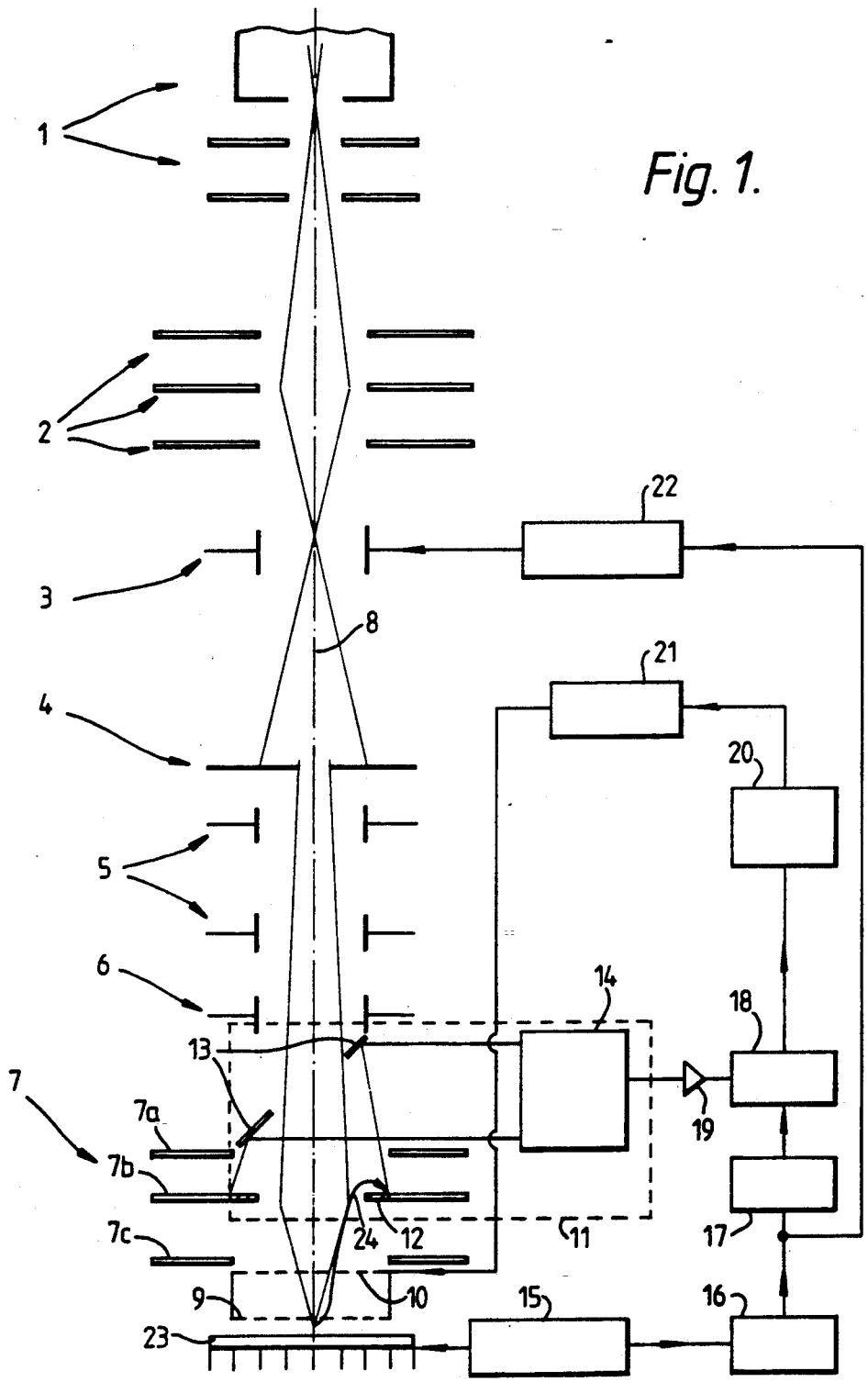
FIG. 1 shows a schematic representation of an ion beam device with an integrated secondary electron spectrometer.

The ion beam measuring device shown in FIG. 1 comprises an ion source 1, a condenser lens 2, a blanking system 3, an aperture diaphragm 4, a deflecting arrangement 5, a stigmator 6 and an objective lens 7 which contains three rotationally symmetrical electrodes 7a, 7b, 7c arranged one behind the other in the beam direction, the axis of the objective lens 7 coinciding with the axis 8 of the ion beam.

A secondary electron spectrometer, which essentially comprises an extraction electrode 9, a filter electrode 10, a secondary electron detector 11 and a control circuit which will be explained in greater detail, is integrated into the ion beam device.

The secondary electron detector 11 consists essentially of a scintillator 12, which is formed by the inner region of the central electrode 7b of the objective lens 7, and also by a mirror 13 (or other optical system) and a multiplier 14. Instead of this the scintillator 12 can also be connected to the multiplier 14 by a photoconductor.

The external control circuit contains a timing generator 15, a phase control 16, a retarding arrangement 17, a gate control 18, a preamplifier 19, a signal-processing circuit 20 and an amplifier 21 the output of which is connected to the filter electrode 10.

The output of the phase control 16 which is connected to the retarding arrangement 17 is also connected via a pulse generator 22 to the blanking system 3.

During potential measurement (i.e. after boring a hole) the ion beam measuring device functions as follows:

The general principle of the control circuit consists of regulating the secondary electron signal to a constant current and simultaneously producing the phase control for the ion beam blanking system 3.

The secondary electrons (arrow 24) emitted by the ion beam when it strikes the testpiece 23 must, after passing through the extraction electrode 9, first of all pass through the filter electrode 10. Since the filter electrode lies at a specific negative potential (which is control by the control circuit, as will be explained below), only those few secondary electrons which have sufficiently high energy are allowed through the filter electrode 10.

If the potential at the examined point on the testpiece 23 changes, the energy distribution of the secondary electrons shifts and correspondingly more or fewer electrons come to the scintillator 12 of the secondary electron detector 11. The potential of the filter electrode 10 is adjusted so that the secondary electron current remains constant. Thus the potential of the filter electrode 10 is altered as a function of the potential to be measured on the testpiece 23. Thus the changing potential of the filter electrode 10 represents a measurement for the potential of the testpiece 23 which is to be measured.

In detail, the external control circuit works as follows:

The secondary electron detector 11 converts the secondary electron signal into an electrical signal which after amplification in the preamplifier 19 is sampled by the gate control 18. This sampling is controlled by the timing generator 15 which simultaneously also drives the testpiece 23 to be examined. The phase control 16 makes it possible to set the time at which sampling takes place.

The ion beam blanking system 3 is controlled by the output of the phase control 16 via the pulse generator 22. The retarding arrangement 17 is provided in order to take account of the transmission time of the ion beam from the blanking system 3 to the testpiece 23.

In the signal-processing circuit 20 the output signal from the preamplifier 19 which is sampled by the gate control 18 is averaged in order to improve the signal to noise ratio. By means of a comparator a comparison is made with a reference value which corresponds to the desired constant secondary electron current. The output signal passes via the amplifier 21 to the filter electrode 10 and keeps the secondary electron current constant in the manner already explained by changing the negative potential of the filter electrode 10, even when the potential to be measured at the examined point on the testpiece 23 changes.

Instead of a blanking system 3 for blanking the ion beam, a pulsed ion source can of course also be used within the scope of the invention.

The deflector arrangement 5 can be activated to deflect the ion beam. By deflecting the axis of the ion beam, the beam will be directed at various locations on the work piece. The potential can be measured at each location the ion beam is directed toward.

Ion beams etch the metal films and remove part of the metal from conductors the ion beams are directed against. The removal of metal from conductors changes the characteristics of the circuits and changes the potential at specific locations in a circuit. To prevent changes in the characteristics of a circuit when employing an ion beam to measure potential. Metal can be added to the work piece at the location indicated by arrow 105 in FIGS. 1 and 2.

Figure 2:
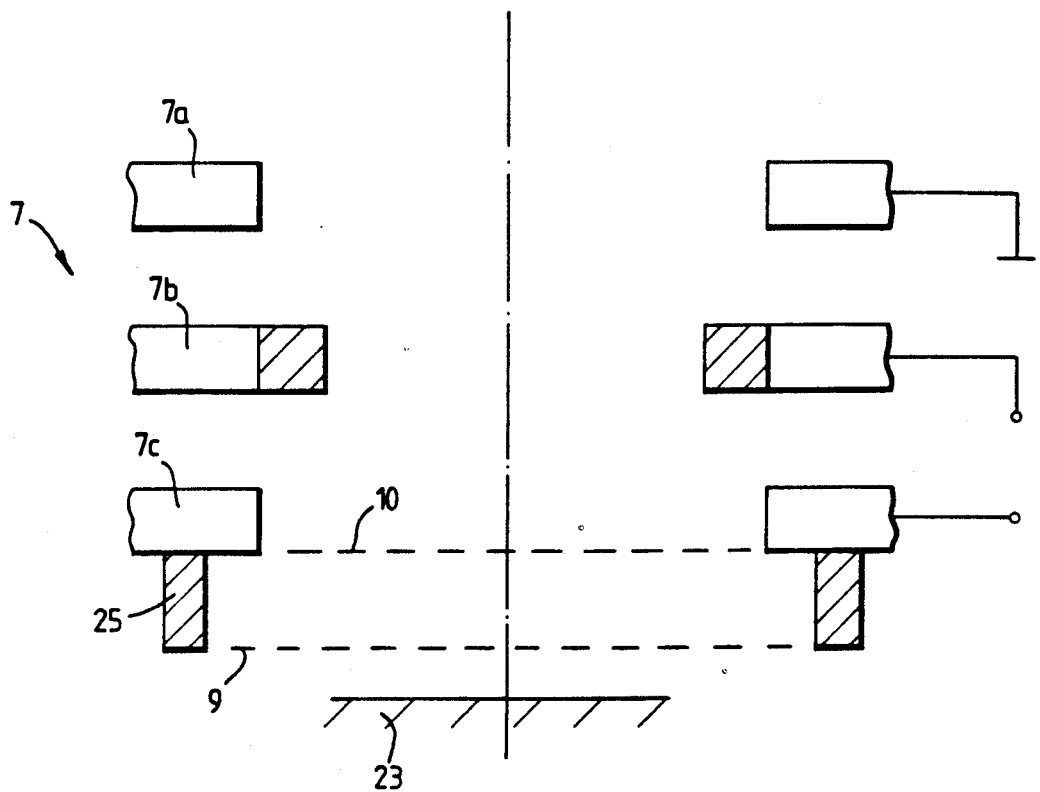
FIG. 2 shows a variant of FIG. 1.

Whereas in the embodiment according to FIG. 1 the extraction electrode 9 and the filter electrode 10 are arranged between the testpiece 23 and the electrode 7c of the objective lens 7 adjacent to the testpiece 23, FIG. 2 shows an embodiment in which the filter electrode 10 is arranged at the height of the electrode 7c of the objective lens 7 adjacent to the testpiece 23 and is kept at the same potential as this electrode, whilst the extraction electrode 9 is arranged between this electrode 7c and the testpiece 23 (in this case the extraction electrode 9 is held on the electrode 7c by means of an insulating element 25).

Whereas in the embodiment according to FIG. 1 the electrodes 7a and 7c are at near-earth potential and the central electrode 7b is strongly positively charged, in the embodiment according to FIG. 2 the earth connection of the electrode 7c is omitted because this electrode 7c is electrically connected to the filter electrode 10 controlled by the control circuit.

In the ion beam device according to the invention the objective lens 7 can also be formed by an electrostatic retarding lens. A retarding lens is distinguished by the fact the ion energy before the lens (i.e. on the source side) is higher than the ion energy behind the lens (i.e. on the testpiece side). This is achieved by appropriate choice of the voltages on the first and third electrodes (7a and 7c respectively). In a retarding lens the voltage potential of the electrode 7c is more positive than that of the electrode 7a.

I claim:

1. An ion beam device comprising:
   a) means for producing a pulsed ion beam,
   b) means for deflecting the ion beam,
   c) an electrostatic objective lens for focussing the ion beam onto a testpiece, said lens having three rotationally symmetrical electrodes arranged one behind the other in the beam direction, the axis of the objective lens coinciding with the axis of the ion beam, characterised by the further features:
   d) a secondary electron spectrometer having an extraction electrode, a filter electrode, a scintillator and a control circuit connecting the scintillator to the filter electrode integrated into the ion beam device; and
   e) the scintillator is formed by the central electrode of the objective lens.

2. The device as claimed in claim 1, characterised in that the extraction electrode and the filter electrode are arranged between the testpiece and the electrode of the objective lens adjacent to the testpiece.

3. The device as claimed in claim 1, characterised in that the filter electrode is positioned at the height of the electrode of the objective lens adjacent to the testpiece and is kept at the same potential as said electrode, and the extraction electrode is positioned between the electrode and the testpiece.

4. Ion beam device as claimed in claim 1, characterised in that the objective lens is formed by an electrostatic retarding lens.

* * * * *

UNITED STATES PATENT AND TRADEMARK OFFICE
CERTIFICATE OF CORRECTION

PATENT NO. : 5,146,089

DATED : September 8, 1992

INVENTOR(S) : Jurgen Frosien

It is certified that error appears in the above-identified patent and that said Letters Patent is hereby corrected as shown below:

On the Title page, item [75]

Change the inventor's name "Rosien" to -- Frosien --.

Signed and Sealed this

Seventh Day of September, 1993

Attest:

BRUCE LEHMAN

*Attesting Officer*  *Commissioner of Patents and Trademarks*